United States Patent [19]

Young

[11] Patent Number: 5,034,691

[45] Date of Patent: Jul. 23, 1991

[54] MAGNETIC RESONANCE METHODS AND APPARATUS

[75] Inventor: Ian R. Young, Nr. Marlborough, England

[73] Assignee: Picker International, Ltd., Wembley, England

[21] Appl. No.: 471,497

[22] Filed: Jan. 29, 1990

[30] Foreign Application Priority Data

Feb. 1, 1989 [GB] United Kingdom ................ 8902198

[51] Int. Cl.⁵ ............................................ G01R 33/20
[52] U.S. Cl. ................................................. 324/309
[58] Field of Search ........................ 324/307, 309, 312

[56] References Cited

U.S. PATENT DOCUMENTS

| | | | |
|---|---|---|---|
| 4,355,282 | 10/1982 | Young et al. | 324/309 |
| 4,678,996 | 7/1987 | Haacke et al. | 324/309 |
| 4,901,020 | 2/1990 | Ladebeck et al. | 324/309 |

FOREIGN PATENT DOCUMENTS

| | | | |
|---|---|---|---|
| 0256779 | 2/1988 | European Pat. Off. | |
| 2125563 | 3/1984 | United Kingdom | 324/309 |

OTHER PUBLICATIONS

Ljunggren, "A Simple Graphical Representation of Fourier-Based Imaging Methods", *J. of Magnetic Resonance*, 54, 338-343, 1983.

*Primary Examiner*—Michael J. Tokar
*Attorney, Agent, or Firm*—Timothy B. Gurin

[57] ABSTRACT

A magnetic resonance method comprising the steps of exciting magnetic resonance in nuclei in a planar region of a body, applying a first gradient magnetic field having a periodically reversing gradient in a first direction across the region in conjunction with a series of pulses of a second gradient magnetic field in a second direction across the region orthogonal to the first direction, progressively decreasing the time between successive pulses of the second gradient, sensing resonance signals from the nuclei, and subjecting the resonance signals to a two-dimensional Fourier Transform process to acquire data relating to the region of the body. In the method the time between successive pulses of the second gradient is decreased in such a manner as to avoid acquisition of data in respect of areas in the corners of a rectangular matrix defined by the first and second gradient fields. Also, in the method the time between successive reversals of the gradient of the first gradient field is caused to vary in corresponding manner to the time between successive pulses of the second gradient field.

4 Claims, 3 Drawing Sheets

MAGNETIC RESONANCE METHODS AND APPARATUS

This invention relates to magnetic resonance methods and apparatus.

More particularly the invention relates to such methods and apparatus wherein, after excitation of magnetic resonance in a planar region, i.e. a region containing a cross-sectional slice of a body to be examined, a first gradient magnetic field having a periodically reversing gradient in a first direction across the slice is applied in conjunction with a series of pulses of a second gradient magnetic field in a second direction across the slice orthogonal to the first direction. The timing and magnitudes of these gradients are such that the planar region is effectively divided into a rectangular matrix of elements, the nuclei within each of a plurality of parallel strips of the matrix orthogonal to the first direction resonating within a unique frequency band and nuclei at different positions along each strip being distinguishable by phase dispersion caused by the second gradient field. The free induction decay signals and rephasing signals emitted by the nuclei as the first and second gradients are applied are sensed, the rephasing signals reversed to form, in effect, further free induction decay signals, and the first and further free induction decay signals arranged in a two dimensional array to give free induction decays in two orthogonal directions. Data relating to the planar region are then acquired by subjecting the signal array to a two-dimensional Fourier Transform process.

Such a method, and apparatus for carrying out the method, hereinafter referred to as methods and apparatus of the kind specified, form the subject of U.S. Pat. No. 4355282 which is hereby incorporated by reference.

The present invention provides a modification of such a method and apparatus.

According to the present invention in a method of the kind specified the time between successive pulses of the second gradient is varied, thereby effectively to apply a spatial filter to the data for a given rate of data acquisition.

Normally the times of reversal of the gradient of the first gradient field will be varied in corresponding manner to said time between successive pulses of the second gradient.

In one particular embodiment of the invention said period between successive pulses is varied in such a manner as to avoid acquisition of data in respect of areas in the corners of the rectangular matrix defined by said first and second gradient magnetic fields.

The invention also provides apparatus for carrying out a method according to the present invention.

One method and apparatus in accordance with the present invention will now be described by way of example with reference to the accompanying drawings in which:

FIGS. 1(A) through 1(E) illustrate pulse sequences used in the method;

Figure 5:
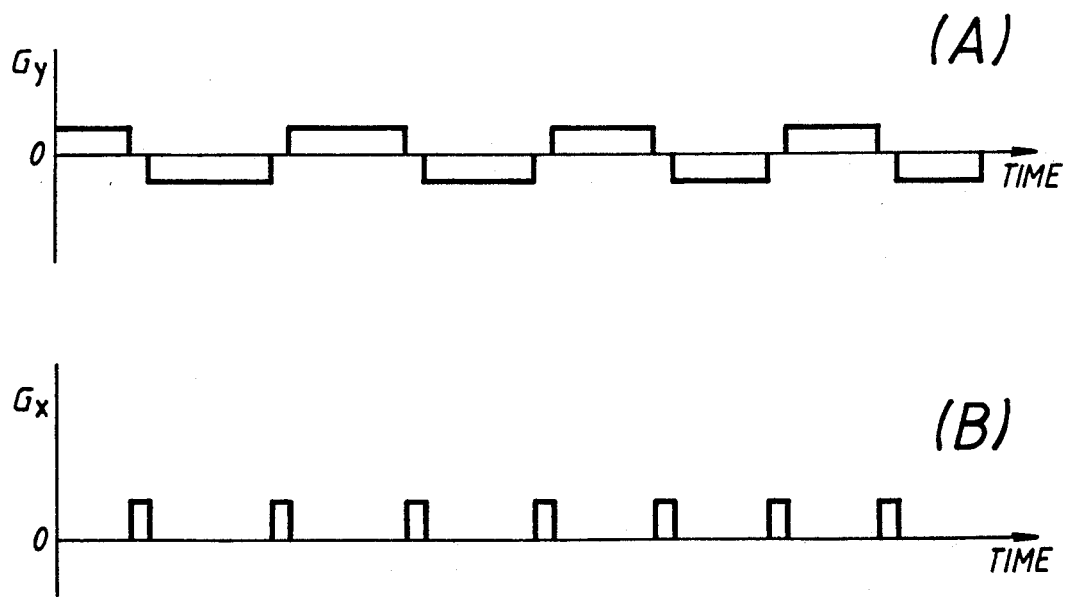
Figure 4:
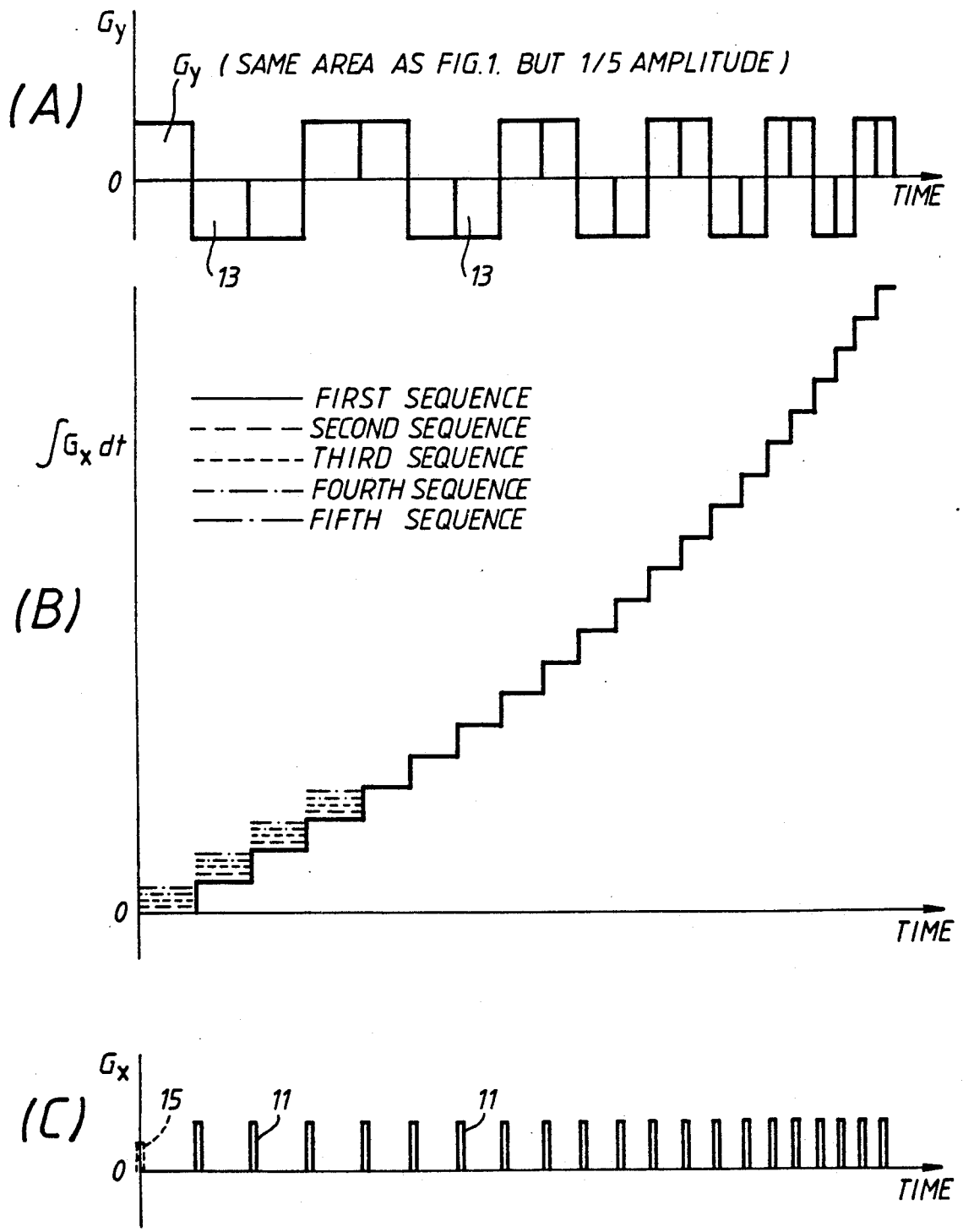

FIGS. 4(A) through 4(C) illustrate pulse sequences used in a first modification of the method of FIGS. 1(A) through 1(E); and FIGS. 5(A) and 5(B) illustrate pulse sequences used in a second modification of the method of FIGS. 1(A) through 1(E).

Figure 1:
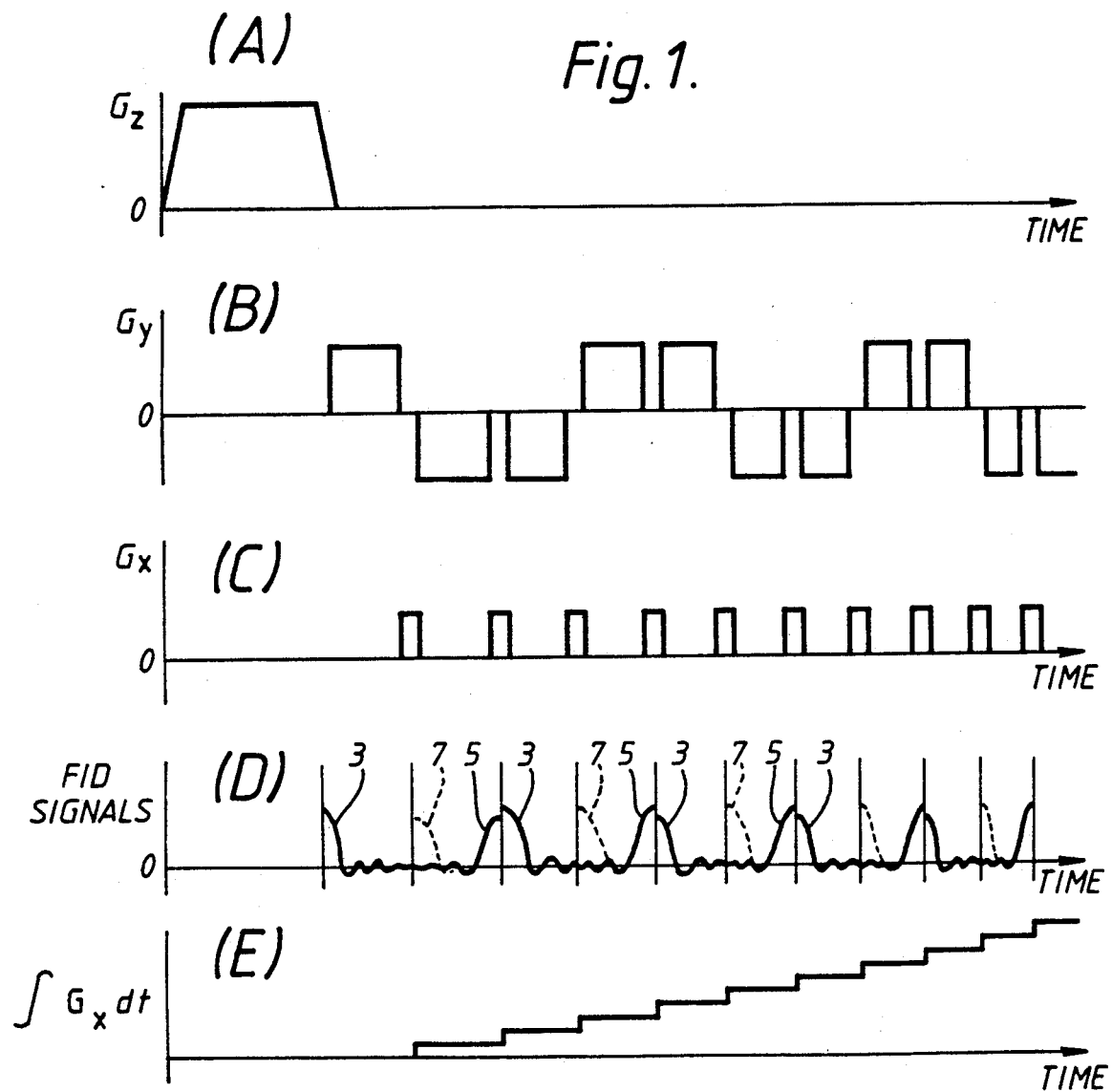
Figure 2:
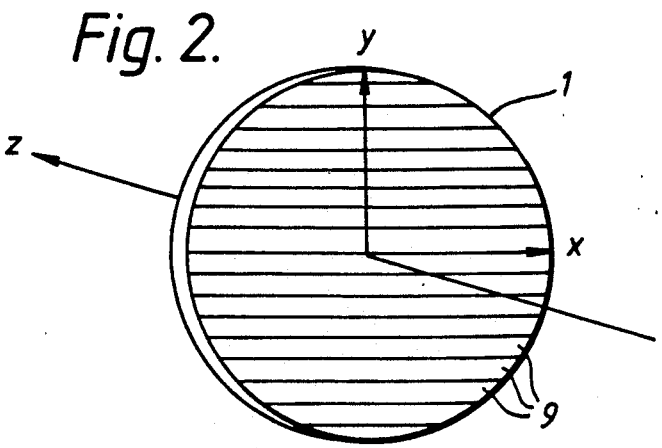
FIG. 2 shows a slice of a body being examined using the sequences of FIGS. 1(A) through 1(E).

The method is intended for use in obtaining an image of a cross-sectional slice of a patient's body for medical diagnostic purposes. As in all magnetic resonance imaging methods, the first step is to provide a large uniform steady magnetic field to define an equilibrium axis of magnetic alignment in the body, this field being taken to be in the z direction (see FIG. 2) and being designated $B_o$. A linear magnetic field gradient $G_z$ is then applied simultaneously with an RF pulse (not shown) which, in known manner, excites spins within a region of the body for which the frequency of the RF pulse is substantially equal to the Larmor frequency for selected nuclei, i.e. hydrogen protons, in the body in the field $B_o$ as modified by the gradient $G_z$. FIG. 1A shows the gradient $G_z$ applied during the excitation phase of the sequence, the xy plane slice 1 of the body in which spins are excited being shown in FIG. 2.

After excitation, linear magnetic field gradients $G_x$ and $G_y$ are applied in the x and y directions to encode spatially the excited spins, so that spins arising from different locations in the slice 1 can be distinguished (see FIGS. 1B and 1C). The $G_y$ gradient is a periodically reversing gradient so that the excited spins alternately decay and re-phase in known manner. The $G_x$ gradient is applied as a series of pulses as described in US-A-4355282 referred to above, the $G_x$ pulses occurring during each $G_y$ pulse and between $G_y$ pulses of opposite polarity, the $G_y$ gradient being absent during the $G_x$ pulses.

The amplitudes of the gradients $G_x$ and $G_y$ are typically of the order 1 : 100 and are thus not shown to scale in FIGS. 1(B) and 1(C). Furthermore the gradients are applied in such a manner that the magnetic field at the centre of the planar region being examined remains constant at $B_o$ at all times.

Figure 3:
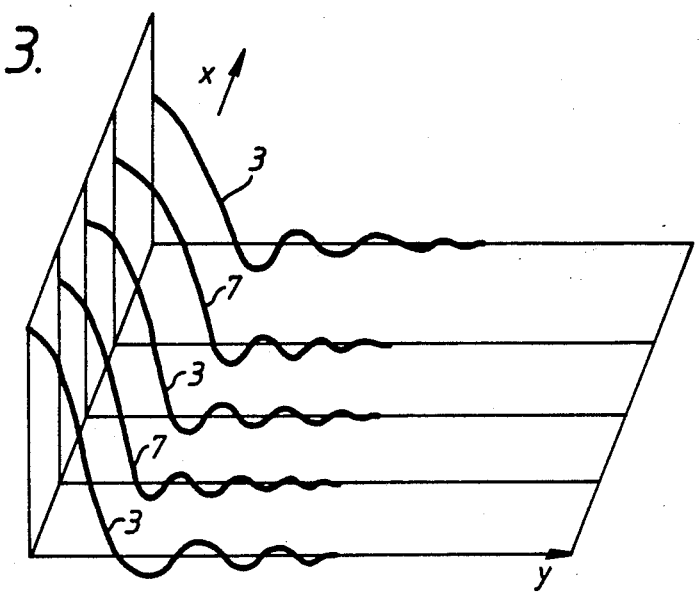
FIG. 3 illustrates an array of free induction decay signals produced in use of the method.

The resulting free induction decay (FID) signals 3 and re-phasing signals 5 (see FIG. 1D) are detected. Each re-phasing signal is mirror imaged, to form effectively a further FID signal 7, and placed in an array with the true FID signals, as shown in FIG. 3. This array comprises information for both x and y directions and can thus be Fourier transformed in two dimensions to give a respective FID signal for each element of a rectangular matrix of elements containing the slice 1.

By virtue of the periodic reversal of the gradient $G_y$, the spin frequencies for elements in each strip of the matrix, and hence each strip 9 of the slice 1 (see FIG. 2) extending in the x direction occupy a discrete frequency band. Similarly, by virtue of the periodic nature of the gradient $G_x$, the spin frequency along each strip of the matrix, and hence each strip 9 changes in steps so that each element along a strip may be taken to have a discrete frequency.

In accordance with the present invention, the time between successive pulses of the gradient $G_x$, and the duration of successive pulses of the gradient $G_y$ decreases with increasing time, as shown in FIGS. 1B and 1C. More particularly, the time between the $G_x$ pulses is reduced after every even-numbered $G_x$ pulse so that each odd $G_x$ pulse lies between $G_y$ pulses of equal duration but opposite polarity to obtain rephasing of spins. As a result signals arising from certain elements of the rectangular matrix are absent from the detected signals. More particularly, signals from the extremities of the strips of the rectangular matrix are absent, the fraction of the length of a strip for which signals are absent increasing with the distance of the strip from the centre of the matrix. Thus signals are absent in respect of the corners of the matrix without loss of signals in respect of the area of interest, i.e. the area of the matrix corresponding to the slice of the body being examined. The reduction in the time between successive reversals thus has the same effect as applying a spatial filter to the acquired data.

It will be appreciated that the invention enables the time required to acquire data to be reduced without loss of any data of interest.

It will further be appreciated that in a method according to the invention the time between successive pulses of the second gradient may be varied in any desired manner to obtain a desired spatial filtering effect.

It will further be understood that the invention is equally applicable to the modification of the method described in US-A-4355282 wherein the required data is obtained in several sequences instead of a single sequence as shown in FIGS. 1(A) through 1(C).

FIGS. 4(A) through 4(C) illustrate such a modified method wherein five sequences are used.

In the modified method each sequence is essentially the same as the sequence of FIGS. 1(A) through 1(E) except that in the first sequence the $G_x$ gradient pulses 11 (see FIG. 4C) are of five times greater amplitude and time spacing and the $G_y$ gradient pulses 13 (see FIG. 4A) are of one-fifth the amplitude and five times greater time spacing between reversals. The resulting FID signals (not shown) thus correspond to the first and every subsequent fifth FID of FIG. 1(D). The second sequence is the same except that a prepulse 15 of amplitude one fifth of the pulses 11 is applied at the start of the sequence so that the FID's obtained correspond to the second and every subsequent fifth FID of FIG. 1(D). The third, fourth and fifth sequences are the same except that the prepulses 15 for these sequences have amplitudes of respectively two, three and four fifths of the amplitude of the pulses 11. FIG. 4B illustrates the resulting step changes in the integral of the gradient field for each of the five sequences, the corresponding step changes for the sequence of FIG. 1 being shown in FIG. 1E.

The advantage of the method of FIGS. 4(A) through 4(C) is that the reduced amplitude of the gradient $G_y$ simplifies the problem of switching the gradient $G_y$.

It will be appreciated that whilst in the methods described above by way of example the $G_x$ gradient pulses occur during each $G_y$ pulse and between $G_y$ pulses of opposite polarity, other arrangements are possible in other methods in accordance with the invention. For example, in a modification of the method of FIGS. 1(A) through 1(E), the $G_x$ pulses may occur only between $G_y$ pulses of opposite polarity, as illustrated in FIGS. 5(A) and 5(B).

The apparatus for carrying out the methods described above by way of example may be precisely as described in FIGS. 8 to 13 of the above-mentioned U.S. Pat. specification No. 4355282 with appropriate data stored in the X and Y profile stores 29x and 29y of FIG. 12.

I claim:

1. A magnetic resonance method comprising the steps of: exciting magnetic resonance in a planar region of a body; applying a first gradient magnetic field having a periodically reversing gradient in a first direction across said region in conjunction with a series of pulses of a second gradient magnetic field in a second direction across said region orthogonal to the first direction, the timing and magnitude of these gradients being such that said region is effectively divided into a rectangular matrix of elements, nuclei of the body within each of a plurality of parallel strips of the matrix orthogonal to said first direction resonating within a unique frequency band and nuclei at different positions along each strip being distinguishable by phase dispersion caused by said second gradient field; sensing free induction decay signals and rephasing signals emitted by the nuclei as the first and second gradients are applied; reversing the sensed rephasing signals to form, in effect, further free induction decay signals; arranging the first and further free induction decay signals in a two dimensional array; and subjecting the array to a two-dimensional Fourier Transform process to acquire data relating to said region of the body; the method including the improvement that the time between successive pulses of the second gradient is varied, thereby effectively to apply a spatial filter to the data for a given rate of data acquisition.

2. A method according to claim 1 wherein said time between said successive pulses of said second gradient is decreased with increasing time.

3. A method according to claim 2 wherein said time between said successive pulses of said second gradient is decreased in such a manner as to avoid acquisition of data in respect of areas in the corners of the rectangular matrix defined by said first and second gradient magnetic fields.

4. A method according to claim 1 wherein the time between successive reversals of the gradient of the first gradient field is varied in corresponding manner to the time between successive pulses of the second gradient field.

* * * * *